(12) United States Patent
Kuo et al.

(10) Patent No.: US 12,213,389 B2
(45) Date of Patent: Jan. 28, 2025

(54) MEMORY DEVICE

(71) Applicant: UNITED MICROELECTRONICS CORP., Hsin-Chu (TW)

(72) Inventors: Chih-Wei Kuo, Tainan (TW); Chung-Yi Chiu, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 44 days.

(21) Appl. No.: 18/239,104

(22) Filed: Aug. 28, 2023

(65) Prior Publication Data

US 2023/0403952 A1  Dec. 14, 2023

Related U.S. Application Data

(63) Continuation of application No. 17/372,528, filed on Jul. 12, 2021, now Pat. No. 11,785,867.

(30) Foreign Application Priority Data

Jun. 11, 2021  (CN) .......................... 202110651873.9

(51) Int. Cl.
*H10N 70/00* (2023.01)
*H10B 63/10* (2023.01)
*H10N 70/20* (2023.01)

(52) U.S. Cl.
CPC ......... *H10N 70/826* (2023.02); *H10N 70/011* (2023.02); *H10N 70/231* (2023.02); *H10B 63/10* (2023.02)

(58) Field of Classification Search
CPC ................................ H10N 70/00; H10B 63/00
See application file for complete search history.

(56) References Cited

U.S. PATENT DOCUMENTS

| | | |
|---|---|---|
| 7,071,565 B2 | 7/2006 | Li |
| 2017/0243923 A1 | 8/2017 | Jeong |
| 2021/0407590 A1 | 12/2021 | Van Dal |

*Primary Examiner* — Marvin Payen
(74) *Attorney, Agent, or Firm* — Winston Hsu

(57) ABSTRACT

A memory device includes a substrate, a memory unit disposed on the substrate, a first spacer layer, and a second spacer layer. The memory unit includes a first electrode, a second electrode disposed above the first electrode, and a memory material layer disposed between the first electrode and the second electrode. The first spacer layer is disposed on a sidewall of the memory unit and includes a first portion disposed on a sidewall of the first electrode, a second portion disposed on a sidewall of the second electrode, and a bottom portion. A thickness of the second portion is greater than that of the first portion. The second spacer layer is disposed on the first spacer layer. A material composition of the second spacer layer is different from that of the first spacer layer. The bottom portion is disposed between the substrate and the second spacer layer.

8 Claims, 6 Drawing Sheets

MEMORY DEVICE

CROSS REFERENCE TO RELATED APPLICATIONS

This application is a continuation application of U.S. application Ser. No. 17/372,528, filed on Jul. 12, 2021. The content of the application is incorporated herein by reference.

BACKGROUND OF THE INVENTION

1. Field of the Invention

The present invention relates to a memory device and a manufacturing method thereof, and more particularly, to a memory device including a spacer layer and a manufacturing method thereof.

2. Description of the Prior Art

Semiconductor memory devices are used in computer and electronics industries as a means for retaining digital information or data. Typically, the semiconductor memory devices are divided into volatile and non-volatile memory devices. The volatile memory device is a computer memory that loses its stored data when power to the operation is interrupted. Comparatively, in the non-volatile memory device, the stored data will not be lost when the power supply is interrupted. For example, resistive random access memory (RRAM) is a kind of non-volatile memory technology having the characteristics of low operating voltage, low power consumption, and high writing speed and is regarded as a memory structure that can be applied to many electronic devices.

SUMMARY OF THE INVENTION

A memory device and a manufacturing method thereof are provided in the present invention. A spacer layer is formed on a sidewall of a memory unit, and the spacer layer formed on a sidewall of an upper electrode in the memory unit is relatively thicker for protecting the memory unit in subsequent processes and improving manufacturing yield of the memory device accordingly.

According to an embodiment of the present invention, a memory device is provided. The memory device includes a substrate, a memory unit, a first spacer layer, and a second spacer layer. The memory unit is disposed on the substrate, and the memory unit includes a first electrode, a second electrode, and a memory material layer. The second electrode is disposed above the first electrode in a vertical direction, and the memory material layer is disposed between the first electrode and the second electrode in the vertical direction. The first spacer layer is disposed on a sidewall of the memory unit, and the first spacer layer includes a first portion, a second portion, and a bottom portion. The first portion is disposed on a sidewall of the first electrode, and the second portion is disposed on a sidewall of the second electrode. A thickness of the second portion in a horizontal direction is greater than a thickness of the first portion in the horizontal direction. The second spacer layer is disposed on the first spacer layer. A material composition of the second spacer layer is different from a material composition of the first spacer layer, and the bottom portion of the first spacer layer is disposed between the substrate and the second spacer layer in the vertical direction.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 2-6 are schematic drawings illustrating a manufacturing method of a memory device according to an embodiment of the present invention, wherein FIG. 3 is a schematic drawing in a step subsequent to FIG. 2, FIG. 4 is a schematic drawing in a step subsequent to FIG. 3, FIG. 5 is a schematic drawing in a step subsequent to FIG. 4, and FIG. 6 is a schematic drawing in a step subsequent to FIG. 5.

DETAILED DESCRIPTION

The present invention has been particularly shown and described with respect to certain embodiments and specific features thereof. The embodiments set forth herein below are to be taken as illustrative rather than limiting. It should be readily apparent to those of ordinary skill in the art that various changes and modifications in form and detail may be made without departing from the spirit and scope of the present invention.

Before the further description of the preferred embodiment, the specific terms used throughout the text will be described below.

The terms "on," "above," and "over" used herein should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

The ordinal numbers, such as "first", "second", etc., used in the description and the claims are used to modify the elements in the claims and do not themselves imply and represent that the claim has any previous ordinal number, do not represent the sequence of some claimed element and another claimed element, and do not represent the sequence of the manufacturing methods, unless an addition description is accompanied. The use of these ordinal numbers is only used to make a claimed element with a certain name clear from another claimed element with the same name.

The term "etch" is used herein to describe the process of patterning a material layer so that at least a portion of the material layer after etching is retained. When "etching" a material layer, at least a portion of the material layer is retained after the end of the treatment. In contrast, when the material layer is "removed", substantially all the material layer is removed in the process. However, in some embodiments, "removal" is considered to be a broad term and may include etching.

The term "forming" or the term "disposing" are used hereinafter to describe the behavior of applying a layer of material to the substrate. Such terms are intended to describe any possible layer forming techniques including, but not limited to, thermal growth, sputtering, evaporation, chemical vapor deposition, epitaxial growth, electroplating, and the like.

Figure 1:
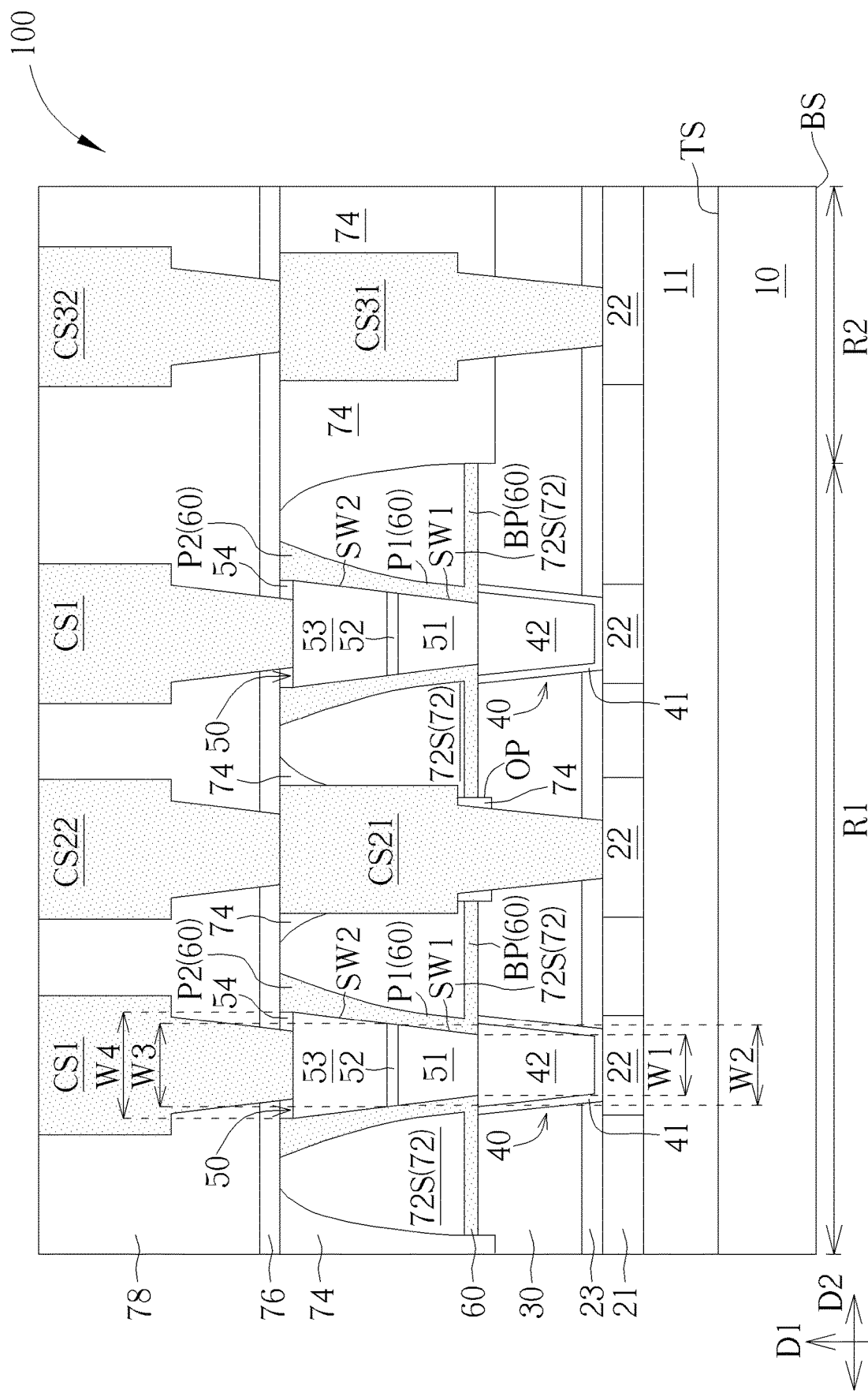
FIG. 1 is a schematic drawing illustrating a memory device according to an embodiment of the present invention.

Please refer to FIG. 1. FIG. 1 is a schematic drawing illustrating a memory device 100 according to an embodiment of the present invention. As shown in FIG. 1, the memory device 100 includes a substrate 10, at least one memory unit 50, and a first spacer layer 60. The memory unit 50 is disposed on the substrate 10, and the memory unit 50 includes a first electrode 51, a second electrode 53, and a memory material layer 52. The second electrode 53 is disposed above the first electrode 51 in a vertical direction (such as a first direction D1 shown in FIG. 1), and the memory material layer 52 is disposed between the first electrode 51 and the second electrode 53 in the first direction D1. The first spacer layer 60 is disposed on a sidewall of the memory unit 50 (such as a sidewall SW1 of the first electrode 51, a sidewall SW2 of the second electrode 53, and a sidewall of the memory material layer 52). The first spacer layer 60 includes a first portion P1 and a second portion P2. The first portion P1 is disposed on the sidewall SW1 of the first electrode 51, and the second portion P2 is disposed on the sidewall SW2 of the second electrode 53. A thickness of the second portion P2 in a horizontal direction (such as a second direction D2 shown in FIG. 1) is greater than a thickness of the first portion P1 in the second direction D2. The relatively thicker second portion P2 covering the sidewall SW2 of the second electrode 53 may be used to improve the protection for the second electrode 53 in related manufacturing processes, and the manufacturing yield of the memory device 100 may be enhanced accordingly.

In some embodiments, the substrate 10 may have a top surface TS and a bottom surface BS opposite to the top surface TS in a thickness direction of the substrate 10 (such as the first direction D1 shown in FIG. 1), and the memory unit 50 and the first spacer layer 60 described above may be disposed at a side of the top surface TS, but not limited thereto. A horizontal direction substantially orthogonal to the first direction D1 (such as the second direction D2 described above) may be substantially parallel with the top surface TS and/or the bottom surface BS of the substrate 10, but not limited thereto. Additionally, in this description, a distance between the bottom surface BS of the substrate 10 and a relatively higher location and/or a relatively higher part in the vertical direction (such as the first direction D1) may be greater than a distance between the bottom surface BS of the substrate 10 and a relatively lower location and/or a relatively lower part in the first direction D1. The bottom or a lower portion of each component may be closer to the bottom surface BS of the substrate 10 in the first direction D1 than the top or upper portion of this component. Another component disposed above a specific component may be regarded as being relatively far from the bottom surface BS of the substrate 10 in the first direction D1, and another component disposed under a specific component may be regarded as being relatively closer to the bottom surface BS of the substrate 10 in the first direction D1, but not limited thereto.

In some embodiments, the memory unit 50 may be a structure with wide top and narrow bottom, and a thickness of the first spacer layer 60 surrounding the memory unit 50 in the horizontal direction (such as the second direction D2 and other directions perpendicular to the first direction D1) may gradually decrease from the top to the bottom. Therefore, the overall width of the memory unit 50 and the first spacer layer 60 disposed thereon may also have the characteristics of being wide at the top and narrow at the bottom. In some embodiments, a top width of the first electrode 51 (such as a width W2 shown in FIG. 1) may be greater than a bottom width of the first electrode 51 (such as a width W1 shown in FIG. 1), and a top width of the second electrode 53 (such as a width W4 shown in FIG. 1) may be greater than a bottom width of the second electrode 53 (such as a width W3 shown in FIG. 1). A width of the second electrode 53 (such as the width W3 and/or the width W4) may be greater than a width of the first electrode 51 (such as the width W1 and/or the width W2), and a width of the memory material layer 52 may range from the width W2 of the first electrode 51 to the width W3 of the second electrode 53, but not limited thereto. In addition, the width of each component described above may also be regarded as a length of the component in the horizontal direction (such as the second direction D2). The memory unit 50 having the structure with wide top and narrow bottom may be helpful to the formation of the first spacer layer 60 including the relatively thicker second portion P2, and some portions of the first spacer layer 60 may be relatively thinner for avoiding the negative influence of comprehensively increasing the thickness of the first spacer layer 60 on other related manufacturing processes.

In some embodiments, the memory device 100 may further include a second spacer layer 72 disposed on the first spacer layer 60, and the first spacer layer 60 may further include a bottom portion BP disposed between the substrate 10 and the second spacer layer 72 in the first direction D1. In some embodiments, the first portion P1, the second portion P2 and the bottom portion BP of the first spacer layer 60 may be directly connected with one another and have an L-shaped structure in a cross-sectional diagram of the memory device 100 (such as FIG. 1), but not limited thereto. In addition, the thickness of the second portion P2 may be greater than the thickness of the first portion P1 and a thickness of the bottom portion BP. In some embodiments, the thickness of the second portion P2 of the first spacer layer 60 may be defined as a distance between a surface of the second portion P2 contacting the second electrode 53 and a surface of the second portion P2 contacting the second spacer layer 72 in the horizontal direction (such as the second direction D2), the thickness of the first portion P1 of the first spacer layer 60 may be defined as a distance between a surface of the first portion P1 contacting the first electrode 51 and a surface of the first portion P1 contacting the second spacer layer 72 in the horizontal direction (such as the second direction D2), and the thickness of the bottom portion BP of the first spacer layer 60 may be defined as a distance between a surface of the bottom portion BP contacting the second spacer layer 72 and a surface of the bottom portion BP facing the substrate 10 in the first direction D1. Additionally, in some embodiments, the top surface of the first spacer layer 60 may be higher than the top surface of the second electrode 53 in the first direction D1 for ensuring that the second electrode 53 may be completely covered by the second portion P2 of the first spacer layer 60 in the horizontal direction (such as the second direction D2 and other directions perpendicular to the first direction D1), but not limited thereto.

Because of the influence of the shape of the memory unit 50 and the shape of the first spacer layer 60, at least a part of the second spacer layer 72 may be regarded as a spacer structure 72s with narrow top and wide bottom, and the bottom portion BP of the first space layer 60 may be disposed between the substrate 10 and the spacer structure 72S in the first direction D1. In some embodiments, a part of the second spacer layer 72 and/or a part of the spacer structure 72S may be located between the bottom portion BP of the first spacer layer 60 and the first portion P1 of the first spacer layer 60 in the first direction D1, and another part of the second spacer layer 72 and/or another part of the spacer structure 72S may be located between the bottom portion BP of the first spacer layer 60 and the second portion P2 of the first spacer layer 60 in the first direction D1. Additionally, a material composition of the second spacer layer 72 may be different from a material composition of the first spacer layer 60 for providing required etching selectivity in the related manufacturing processes. For example, the first spacer layer 60 may be made of a nitride dielectric material (such as silicon nitride) or other suitable dielectric materials, and the second space layer 72 may be made of an oxide dielectric material (such as silicon oxide) or other suitable dielectric materials different from the material of the first space layer 60.

In some embodiments, the memory device 100 may include a plurality of memory units 50, the corresponding first spacer layers 60, and the corresponding second spacer layers 72. In addition, the memory device 100 may further include a plurality of metal interconnections 40 disposed on the substrate 10, and each of the metal interconnections 40 may be disposed under one of the memory units 50 and electrically connected with the first electrode 51 of the memory unit 50. In some embodiments, each of the metal interconnections 40 may be regarded as a via conductor mainly elongated in the vertical direction (such as the first direction D1), but not limited thereto. In some embodiments, each of the metal interconnections 40 may include a barrier layer 41 and a metal layer 42. The barrier layer 41 may include titanium (Ti), titanium nitride (TiN), tantalum (Ta), tantalum nitride (TaN) or other suitable barrier materials, and the metal layer 42 may include tungsten (W), copper (Cu), aluminum (Al), titanium aluminide (TiAl), cobalt tungsten phosphide (CoWP), or other suitable metallic materials.

In some embodiments, the substrate 10 may include a semiconductor substrate or a non-semiconductor substrate. The semiconductor substrate may include a silicon substrate, a silicon germanium semiconductor substrate, or a silicon-on-insulator (SOI) substrate, and the non-semiconductor substrate may include a glass substrate, a plastic substrate, or a ceramic substrate, but not limited thereto. For example, when the substrate 10 includes a semiconductor substrate, a plurality of silicon-based field effect transistors (not illustrated), a dielectric layer (such as a dielectric layer 11 and a dielectric layer 21 shown in FIG. 1) covering the silicon-based field effect transistors, and metal interconnections 22 may be formed on the semiconductor substrate before the step of forming the metal interconnections 40 described above. In some embodiments, the metal interconnections may be electrically connected with some of the metal interconnections 22, respectively, and the metal interconnections may be electrically connected downward to the silicon-based field effect transistor described above via some of the metal interconnections 22, but not limited thereto. In some embodiments, each of the metal interconnections 22 may be regarded as a trench conductor mainly elongated in a horizontal direction. Additionally, in some embodiments, the substrate 10 may include a first region R1 and a second region R2. The first region R1 may be regarded as a memory cell region with the memory units 50 disposed thereon, and the second region R2 may be regarded as a logic region, but not limited thereto. In some embodiments, the region located between the first regions R1 adjacent to each other may be regarded as a region corresponding to word lines, and the metal interconnection 22 disposed in this region may include a word line or electrically connected with a word line, but not limited thereto.

In some embodiments, the memory device 100 may further include a stop layer 23, an inter-metal dielectric (IMD) layer 30, a low dielectric constant (low-k) dielectric layer 74, a stop layer 76, a low-k dielectric layer 78, and a plurality of connection structures (such as connection structures CS1, a connection structure CS21, a connection structure CS22, a connection structure CS31, and a connection structure CS32). The IMD layer 30 may be disposed on the substrate 10 and located on the dielectric layer 21. The stop layer 23 may be disposed between the IMD layer 30 and the dielectric layer 21. The metal interconnection 40 may penetrate through the IMD layer 30 and the stop layer 23 in the first direction D1. The first spacer layer 60 and the second spacer layer 72 may be disposed on the IMD layer 30 and the metal interconnections 40. An opening OP may be disposed above the metal interconnection 22 located between the memory units 50 adjacent to each other and penetrate through the second space layer 72 and the first spacer layer 60 in the first direction D1. The low-k dielectric layer 74 may be disposed on the IMD layer 30 and the second spacer layer 72, and a part of the low-k dielectric layer 74 may be disposed in the opening OP. The connection structure CS21 may be disposed between the memory units 50 adjacent to each other and penetrate through the stop layer 23, the IMD layer 30, and the low-k dielectric layer 74 in the opening OP for being electrically connected with the metal interconnection 22 located between the memory units 50 adjacent to each other. The connection structure CS31 may be disposed on the second region R2 and penetrate through the stop layer 23, the IMD layer 30, and the low-k dielectric layer 74 for being electrically connected with the metal interconnection 22 on the second region R2.

The stop layer 76 may be disposed on the low-k dielectric layer 74, the second spacer layer 72, the first spacer layer 60, a mask layer 54, the connection structure CS21, and the connection structure CS31, and the low-k dielectric layer 78 may be disposed on the stop layer 76. The connection structure CS1 may penetrate through the low-k dielectric layer 78, the stop layer 76, and the mask layer 54 on the memory unit 50 in the first direction D1 for contacting and being electrically connected with the second electrode 53. The connection structure CS22 may penetrate through the low-k dielectric layer 78 and the stop layer 76 on the connection structure CS21 in the first direction D1 for contacting and being electrically connected with the connection structure CS21. The connection structure CS32 may penetrate through the low-k dielectric layer 78 and the stop layer 76 on the connection structure CS31 in the first direction D1 for contacting and being electrically connected with the connection structure CS31. In some embodiments, each of the connection structures described above (such as the connection structure CS1, the connection structure CS21, the connection structure CS22, the connection structure CS31, and/or the connection structure CS32) may include a via conductor and a trench conductor disposed on and connected with the via conductor, but not limited thereto.

In some embodiments, the structure of each of the metal interconnections 22 and the structure of each of the connection structures (such as the connection structure CS1, the connection structure CS21, the connection structure CS22, the connection structure CS31, and/or the connection structure CS32) may be similar to that of the metal interconnection 40 and include a barrier layer (not illustrated) and a metal layer (not illustrated), but not limited thereto. In some embodiments, the dielectric layer 11, the dielectric layer 21, and the IMD layer 30 may respectively include silicon oxide, a low-k dielectric material, or other suitable dielectric materials. The low-k dielectric layer 74 and the low-k dielectric layer 78 may respectively include a dielectric material with a dielectric constant lower than 2.7, such as benzocyclclobutene (BCB), hydrogen silsesquioxane (HSQ), methyl silesquioxane (MSQ), hydrogenated silicon oxycarbide (SiOC—H), a porous dielectric material, or other suitable dielectric materials. The stop layer 23 and the stop layer 76 may respectively include nitrogen doped carbide (NDC), silicon nitride, silicon carbon-nitride (SiCN), or other suitable insulation materials.

In some embodiments, the first electrode 51 and the second electrode 53 in each of the memory units 50 may respectively include aluminum, platinum, ruthenium, iridium, nickel, cobalt, chromium, tungsten, copper, hafnium, zirconium, zinc, gold, titanium, an alloy of the material described above, a mixture of the material described above, or other suitable metallic electrically conductive materials or non-metallic electrically conductive materials. The memory material layer 52 in each of the memory units 50 may include a variable resistance material, a phase change material, or other suitable materials capable of providing memory operations by changing state. The variable resistance material described above may include metal oxide such as transition metal oxide, perovskite oxide, or other suitable variable resistance materials. The phase change material described above may include germanium antimony telluride ($Ge_2Sb_2Te_5$, GST) or other suitable phase change materials. When the memory material layer 52 is a variable resistance material, the memory unit 50 may be regarded as a resistive memory unit, and the memory material layer 52 may be regarded as a switching medium in the resistive memory unit. The resistance of the resistive memory unit may be changed by applying suitable voltage to the top electrode and the bottom electrode (such as the second electrode 53 and the first electrode 51) in the stacked structure, and the resistive memory unit may switch to high resistance state (HRS) or low resistance state (LRS) for realizing the operation mode of the memory device, such as storing data, reading data, and resetting.

Figure 2:
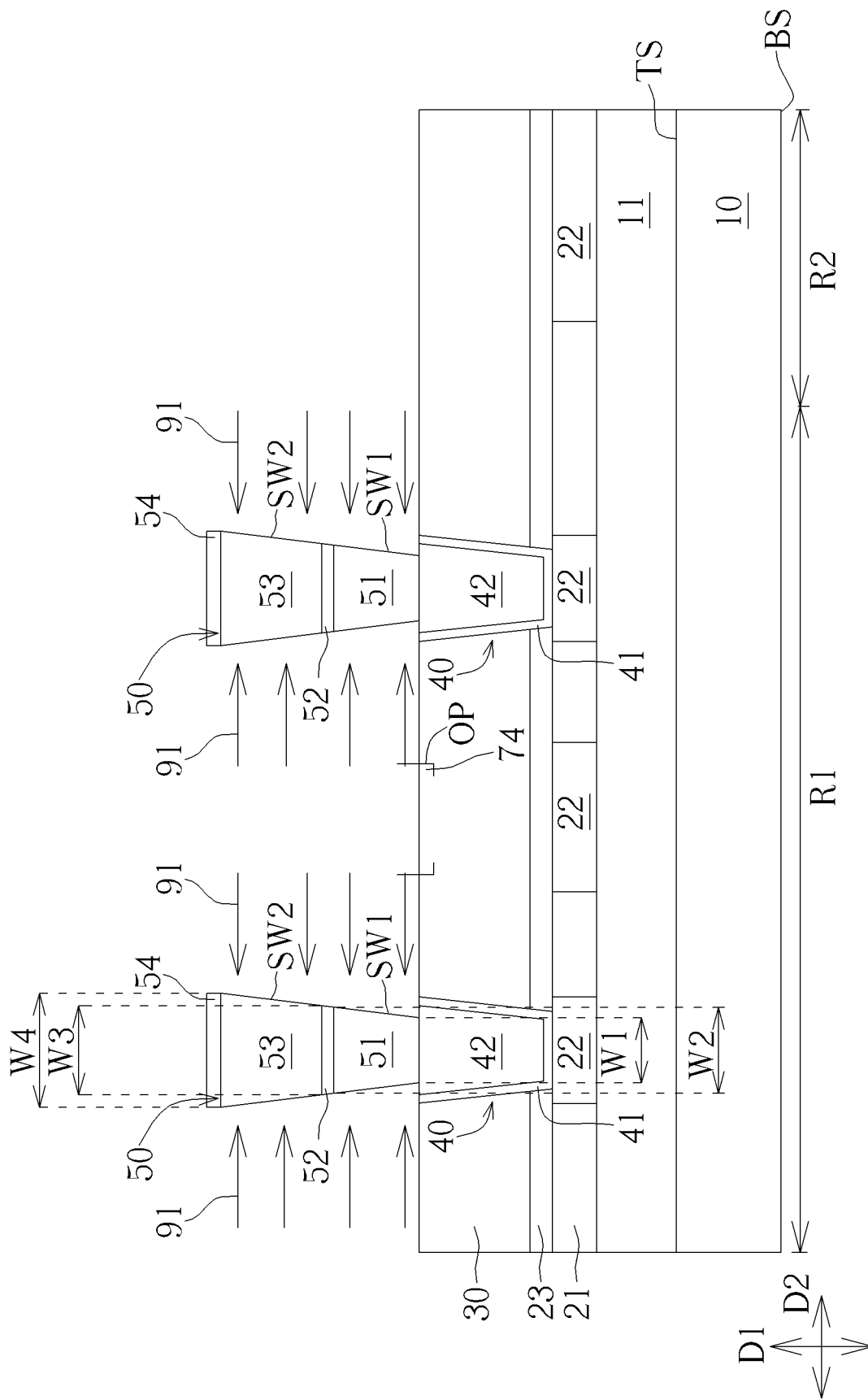
Figure 3:
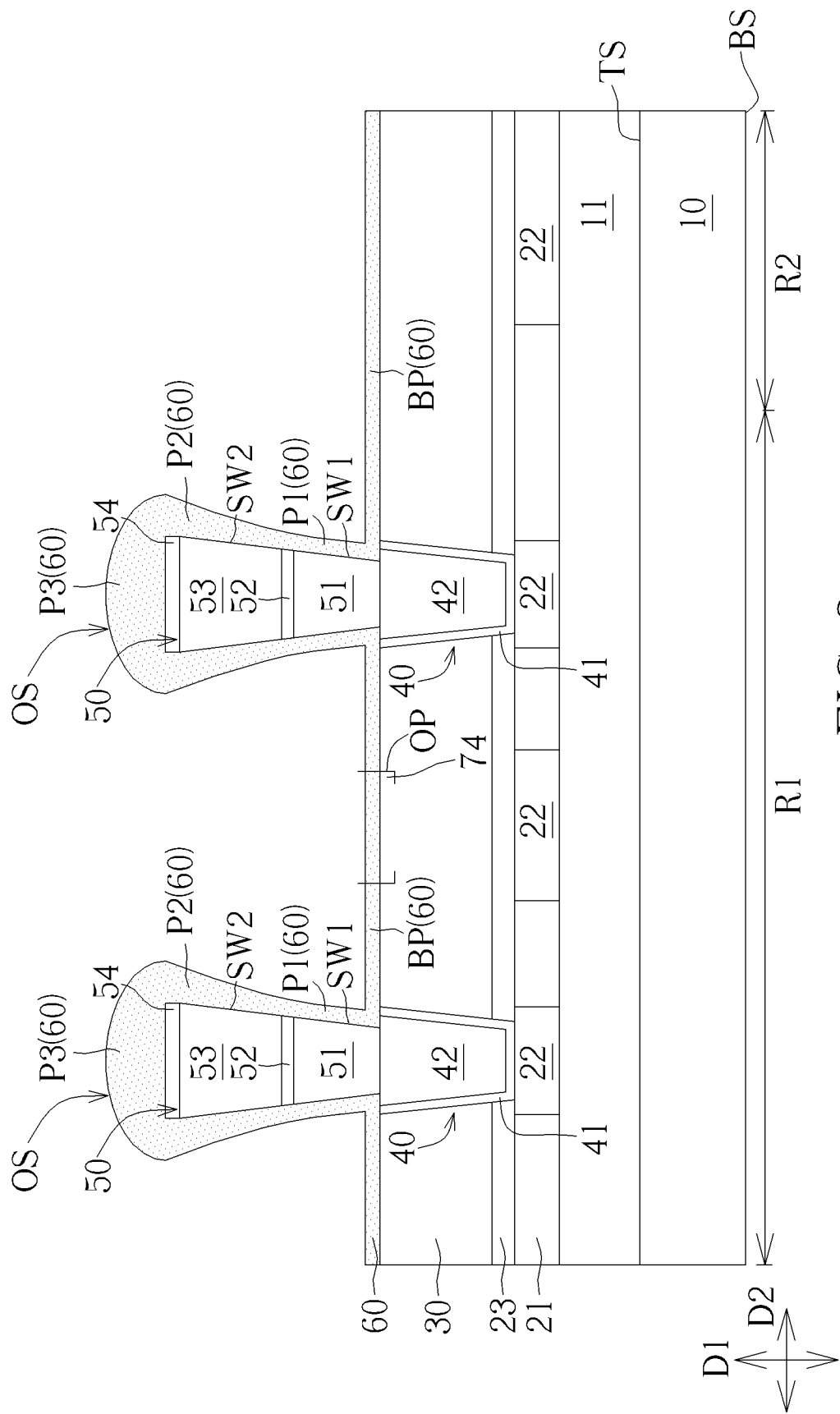
Figure 4:
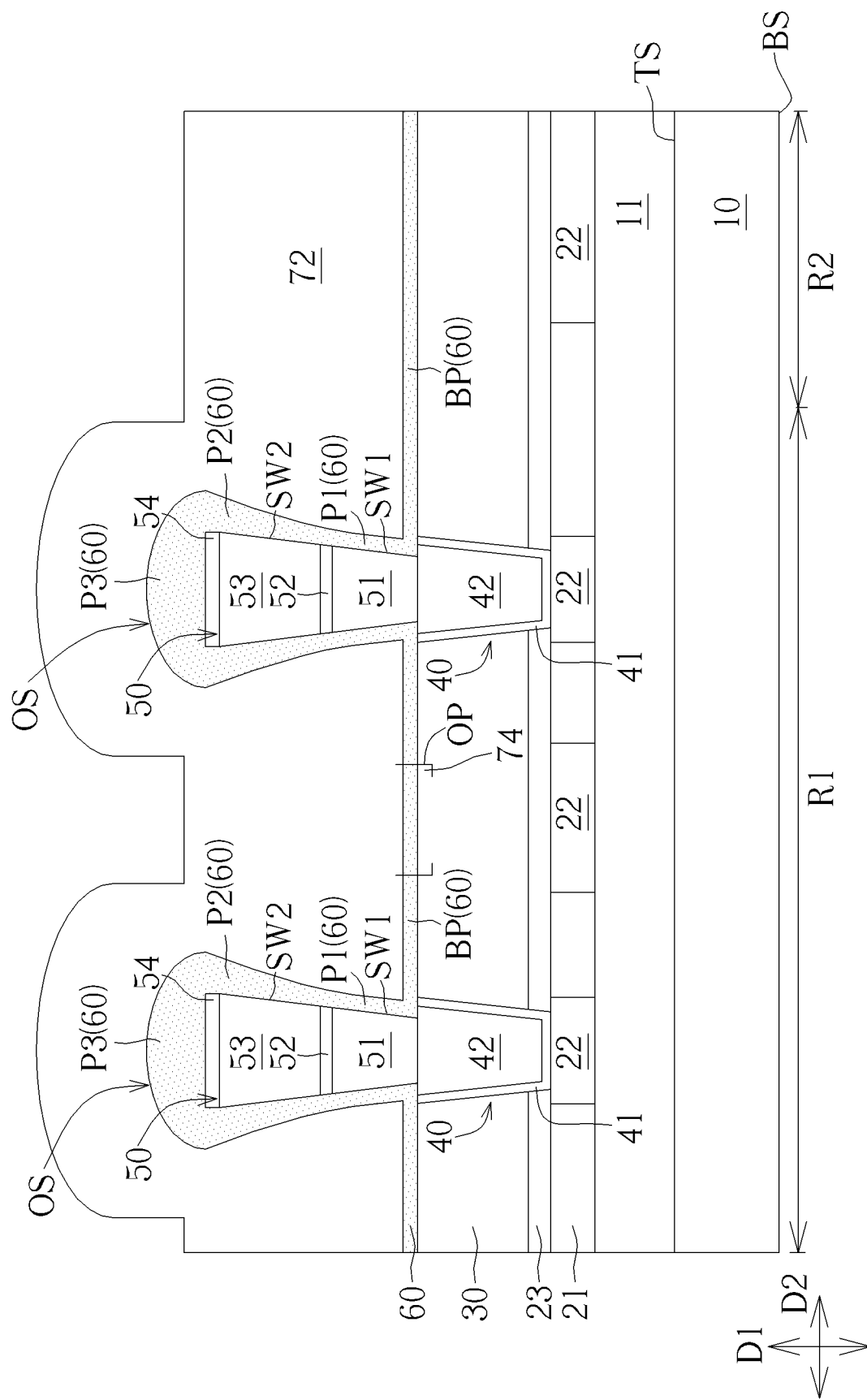
Figure 5:
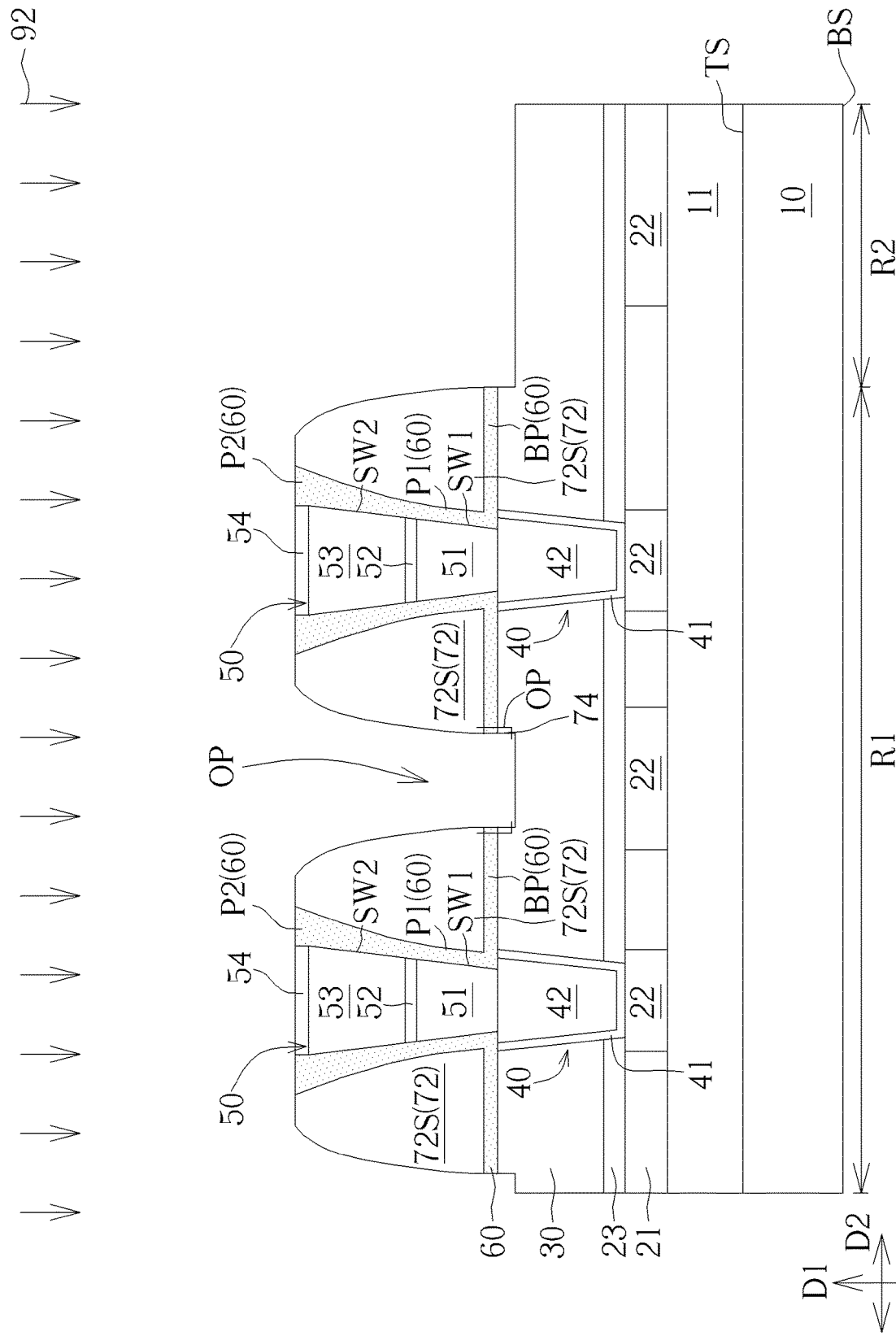
Figure 6:
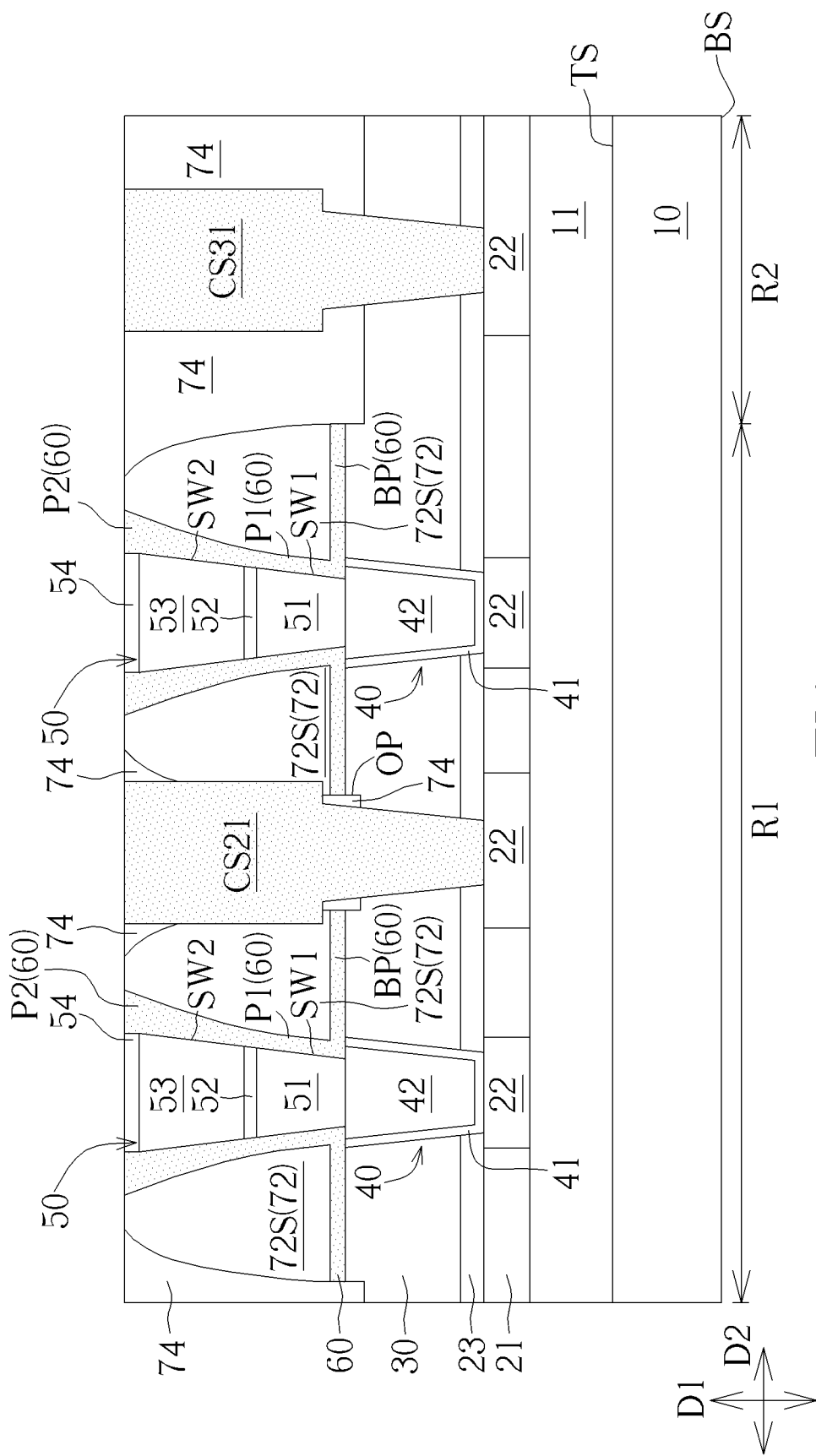

Please refer to FIGS. 2-6 and FIG. 1. FIGS. 2-6 are schematic drawings illustrating a manufacturing method of a memory device according to an embodiment of the present invention, wherein FIG. 3 is a schematic drawing in a step subsequent to FIG. 2, FIG. 4 is a schematic drawing in a step subsequent to FIG. 3, FIG. 5 is a schematic drawing in a step subsequent to FIG. 4, FIG. 6 is a schematic drawing in a step subsequent to FIG. 5, and FIG. 1 may be regarded as a schematic drawing in a step subsequent to FIG. 6, but not limited thereto. As shown in FIG. 1, the manufacturing method of the memory device 100 in this embodiment may include the following steps. The memory unit 50 is formed on the substrate 10, and the memory unit 50 includes the first electrode 51, the second electrode 53, and the memory material layer 52. The second electrode 53 is disposed above the first electrode 51 in the first direction D1, and the memory material layer 52 is disposed between the first electrode 51 and the second electrode 53 in the first direction D1. The first spacer layer 60 is formed on the sidewall of the memory unit 50, and the first spacer layer 60 includes the first portion P1 and the second portion P2. The first portion P1 is disposed on the sidewall SW1 of the first electrode 51, and the second portion P2 is disposed on the sidewall SW2 of the second electrode 53. The thickness of the second portion P2 in a horizontal direction (such as the second direction D2) is greater than the thickness of the first portion P1 in the second direction D2.

Specifically, the manufacturing method of the memory device in this embodiment may include but is not limited to the following steps. Firstly, as shown in FIG. 2, the dielectric layer 11, the dielectric layer 21, the metal interconnections 22, the stop layer 23, the IMD layer 30, the metal interconnections 40, and the memory units 50 are formed on the substrate 10. In some embodiments, a stacked material layer used to form the memory units 50 may be formed on the metal interconnections 40 and the IMD layer 30, and the mask layer 54 may be formed on the stacked material layer. Subsequently, the mask layer 54 and/or a patterned photoresist layer (not illustrated) may be used as an etching mask for performing an etching process to the stacked material layer and forming the memory units 50. The mask layer 54 may include an oxide insulation material or other suitable insulation materials. The etching process described above may include a reactive ion etching (RIE) process or other suitable etching approaches. Additionally, in some embodiments, a lateral trimming process 91 may be performed and used to etch the memory unit 50 for making the memory unit 50 having the above-mentioned structure with wide top and narrow bottom, and the trimming process 91 may be performed in the etching process described above and/or after the etching process described above. For example, the trimming process 91 may be an etching step in the RIE etching process, and the lateral etching performance may be modified by tuning the etching parameters (such as reducing the etching effect generated by polymer) for forming the memory unit 50 having the structure with wide top and narrow bottom. In some embodiments, the memory unit 50 having the structure with wide top and narrow bottom may also be formed by performing the trimming process 91 with material selection and matching of the first electrode 51 and the second electrode 53. In other words, the material composition of the second electrode 53 may be different from the material composition of the first electrode 51, and the rate of etching the first electrode 51 in the trimming process 91 may be slightly higher than the rate of etching the second electrode 53 in the trimming process 91, but not limited thereto.

Subsequently, as shown in FIG. 3, the first spacer layer 60 is formed on the IMD layer 30, the metal interconnections 40, the memory units 50, and the mask layers 54. In some embodiments, because of the influence of the memory unit 50 having the structure with wide top and narrow bottom, the first spacer layer 60 formed on the memory units 50 and the mask layers 54 may have overhang structures OS. For example, the first spacer layer 60 may include the first portion P1, the second portion P2, a third portion P3, and the bottom portion BP. The first portion P1 may be disposed on the sidewall SW1 of the first electrode 51, the second portion P2 may be disposed on the sidewall SW2 of the second electrode 53, the third portion P3 may be disposed above the memory unit 50 and the mask layer 54 in the first direction D1, and the bottom portion BP may be disposed on the IMD layer 30 and the metal interconnections 40. The third portion P3 may be directly connected with the second portion P2, the second portion P2 may be directly connected with the first portion P1, and the first portion P1 may be directly connected with the bottom portion BP. Because of the memory unit 50 having the structure with wide top and narrow bottom and/or by modifying the process parameters of the film forming process of the first spacer layer 60, the third portion P3 and the second portion P2 may be relatively thicker, the first portion P1 and the bottom portion BP may be relatively thinner, and the third portion P3 and a part of the second portion P2 may form the overhang structure OS on the memory unit 50.

Subsequently, as shown in FIG. 4 and FIG. 5, the spacer structure 72S is formed on the first spacer layer 60. The method of forming the spacer structure 72S may include but is not limited to the following steps. As shown in FIG. 4, the second spacer layer 72 may be formed on the first spacer layer 60, and the space between the memory units 50 adjacent to each other may be filled with the second spacer layer 72. As shown in FIG. 4 and FIG. 5, an etching process 92 may be performed after the second spacer layer 72 is formed, and at least a part of the second spacer layer 72 may be etched by the etching process 92 to be the spacer structure 72S. In some embodiments, at least an etching step in the etching process 92 may be regarded as an etching back process for the second spacer layer 72 so as to form the opening OP by removing a part of the second spacer layer 72 (such as the second spacer layer 72 on the memory unit 50 in the first direction D1) and a part of the bottom portion BP of the first spacer layer 60. The opening OP may be located between the memory units 50 adjacent to each other in the second direction D2, and the opening OP may penetrate through the second spacer layer 72 and the first spacer layer 60 in the first direction D1 for exposing a part of the IMD layer 30.

In some embodiments, at least a part of the third portion P3 of the first spacer layer 60 may be located between the second spacer layer 72 and the memory unit 50 in the first direction D1 before the etching process 92, and the third portion P3 of the first spacer layer 60 may be removed by the etching process 92. In addition, the second electrode 53 may be completely covered by the second portion P2 of the first spacer layer 60 in the horizontal direction (such as the second direction D2) before and after the etching process 92 for protecting the second electrode 53. The problem that the sidewall of the second electrode 53 is exposed by over etching the first spacer layer 60 in the etching process 92 may be improved because the overhang structure OS is relatively thicker. The mask layer 54 may cover the top surface of the second electrode 53 before and after the etching process 92, and the second electrode 53 may be protected by the first spacer layer 60 and the mask layer 54 encompassing the second electrode 53 accordingly. Additionally, the opening OP is formed by the etching process 92, the required etching strength of the etching process 92 may be reduced because the bottom portion BP of the first spacer layer 60 is relatively thinner, and the part of the second portion P2 of the first spacer layer 60 etched in the etching process 92 may be relatively reduced accordingly for ensuring that the second electrode 53 is completely covered by the second portion P2 of the first space layer 60 in the horizontal direction. In other words, when the thickness of the first space layer is increased comprehensively, the etching strength has to be relatively increased (such as increasing the etching time) for forming the opening OP penetrating through the first spacer layer 60, the second electrode 53 might be exposed because more of the first spacer layer 60 on the sidewall of the second electrode 53 is etched accordingly, and related manufacturing defects may be generated.

In some embodiments, the etching process 92 may be further used to remove the second spacer layer 72 and the first spacer layer 60 above the second region R2 for exposing the IMD layer 30 above the second region R2. Subsequently, as shown in FIG. 5 and FIG. 6, the low-k dielectric layer 74, the connection structure CS21, and the connection structure CS31 descried above may be formed. In some embodiments, a planarization process may be carried out after the step of forming the low-k dielectric layer 74 and before the step of forming the connection structure CS21 and the connection structure CS31 for making the top surface of the low-k dielectric layer 74, the top surface of the spacer structure 72S, the top surface of the first spacer layer 60, and the top surface of the mask layer substantially coplanar, but not limited thereto. Subsequently, as shown in FIG. 6 and FIG. 1, the stop layer 76, the low-k dielectric layer 78, the connection structures CS1, the connection structure CS22, and the connection structure CS32 described above may be formed for forming the memory device 100 shown in FIG. 1.

To summarize the above descriptions, in the memory device and the manufacturing method thereof according to the present invention, the first spacer layer having the overhang structures may be formed on the memory units for forming the relatively thicker first spacer layer on the sidewall of the second electrode and enhancing the performance of protecting the memory unit in the subsequent manufacturing processes, and the manufacturing yield of the memory device may be improved accordingly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A memory device, comprising:
   a substrate;
   a memory unit disposed on the substrate, wherein the memory unit comprises:
     a first electrode;
     a second electrode disposed above the first electrode in a vertical direction; and
     a memory material layer disposed between the first electrode and the second electrode in the vertical direction;
   a first spacer layer disposed on a sidewall of the memory unit, wherein the first spacer layer comprises:
     a first portion disposed on a sidewall of the first electrode;
     a second portion disposed on a sidewall of the second electrode, wherein a thickness of the second portion in a horizontal direction is greater than a thickness of the first portion in the horizontal direction; and
     a bottom portion; and
   a second spacer layer disposed on the first spacer layer, wherein a material composition of the second spacer layer is different from a material composition of the first spacer layer, and the bottom portion of the first spacer layer is disposed between the substrate and the second spacer layer in the vertical direction.

2. The memory device according to claim 1, wherein the second electrode is completely covered by the second portion of the first spacer layer in the horizontal direction.

3. The memory device according to claim 1, wherein a part of the second spacer layer is located between the bottom portion of the first spacer layer and the first portion of the first spacer layer in the vertical direction.

4. The memory device according to claim 1, wherein a part of the second spacer layer is located between the bottom portion of the first spacer layer and the second portion of the first spacer layer in the vertical direction.

5. The memory device according to claim 1, wherein a top width of the first electrode is greater than a bottom width of the first electrode.

6. The memory device according to claim 1, wherein a top width of the second electrode is greater than a bottom width of the second electrode.

7. The memory device according to claim 1, wherein a width of the second electrode is greater than a width of the first electrode.

8. The memory device according to claim 1, wherein the memory material layer comprises a variable resistance material or a phase change material.

* * * * *